United States Patent [19]

Sakai et al.

[11] Patent Number: 4,956,649
[45] Date of Patent: Sep. 11, 1990

[54] IMAGE RECORDING APPARATUS FORMING PHOTOMASKING PATTERN ON PHOTOSENSITIVE MEDIUM

[75] Inventors: Toshio Sakai; Hitoshi Nakai; Makoto Suzuki, all of Nagoya; Kiyoharu Hayakawa, Aichi; Kazunori Tanabe, Nagoya, all of Japan

[73] Assignee: Brother Kogyo Kabushiki Kaisha, Aichi, Japan

[21] Appl. No.: 141,916

[22] Filed: Jan. 11, 1988

[30] Foreign Application Priority Data

Jan. 13, 1987 [JP] Japan ................................. 62-7110
Jan. 13, 1987 [JP] Japan ................................. 62-7111
Jan. 13, 1987 [JP] Japan ................................. 62-7112

[51] Int. Cl.⁵ ........................ G01D 9/42; G03G 13/94; B32B 3/00
[52] U.S. Cl. .......................... 346/107 R; 346/135.1; 346/153.1; 428/203; 428/913; 430/5; 430/48; 430/56; 430/62; 430/126; 430/396
[58] Field of Search ............... 346/76 R, 76 L, 76 PH, 346/74.2, 107 R, 135.1, 153.1; 430/56, 141, 151, 156, 48, 62, 5, 396, 126; 427/127, 128; 428/692, 39, 203, 900, 913

[56] References Cited

U.S. PATENT DOCUMENTS

| 4,346,156 | 8/1982 | Faucz | 430/39 |
| 4,410,614 | 10/1983 | Lelental et al. | 430/45 |
| 4,429,027 | 1/1984 | Chambers, Jr. et al. | 430/5 |
| 4,647,182 | 3/1987 | Pierce | 355/326 |

*Primary Examiner*—Bruce A. Reynolds
*Assistant Examiner*—Gerald E. Preston
*Attorney, Agent, or Firm*—Oliff & Berridge

[57] ABSTRACT

An image recording apparatus including a pattern forming device for forming a light-shielding pattern on one of opposite surfaces of a photosensitive recording medium. The light-shielding pattern is formed of a light-shielding material which is capable of shielding a radiation. The apparatus further includes an exposing device for irradiating the above-indicated one surface of the recording medium, and thereby forming an optical latent image which corresponds to the light-shielding pattern. The light-shielding pattern is removed by a cleaner from the recording medium after the optical latent image is formed. The optical latent image formed on the medium is developed into a visible image.

5 Claims, 11 Drawing Sheets

IMAGE RECORDING APPARATUS FORMING PHOTOMASKING PATTERN ON PHOTOSENSITIVE MEDIUM

BACKGROUND OF THE INVENTION

1. Field of the Invention

The present invention relates to an apparatus for recording or forming desired image information on a photosensitive medium.

2. Discussion of the Prior Art

Image recording systems as shown in FIGS. 4 and 5 are known in the art of recording images on a photosensitive medium.

In the recording system of FIG. 4, an exposing device 1 is used to irradiate an original 4 which bears an image to be reproduced. A radiation produced by a light source 2 of the exposing device 1 is converged on the surface of the original 4, by suitable means such as a reflector 3, and is reflected by the surface of the original 4. The reflected radiation passes through suitable optical focusing means such as a lens array 5, and is focused on the surface of a photosensitive paper 6, which is exposed to the reflected radiation, whereby a latent image corresponding to the image on the original 4 is formed on the exposed photosensitive paper 6. The exposure of the photosensitive paper 6 to the reflected radiation takes place while the paper 6 is fed from a supply roll 7 along a predetermined feed path, toward a developing device 8. In the present illustrated system, the exposed portion of the photosensitive paper 6 is sensitive to a pressure, and the development of the latent image is effected by passing the exposed photosensitive paper 6 through a nip of pressure rollers of the developing device 8. Thus, the latent image optically formed on the photosensitive paper 6 is developed into a visible image corresponding to the image on the original 4.

The recording system of FIG. 5 employs an exposing device in the form of a laser scanner device 9. This scanner device 9 includes a semiconductor laser element 10 for emitting a laser which is eventually incident upon the photosensitive paper 6, by way of a polygon mirror 12 rotated by a drive motor 11, an f-θ lens 13, and a reflector mirror 14. The laser element 10 is operated according to image signals from an external device. Thus, a latent image represented by the image signals is formed on the photosensitive paper 6. The latent image is developed by the developing device 8.

However, the known image recording systems of FIGS. 4 and 5 suffer from the following drawbacks:

In the system of FIG. 4, only a portion of the radiation produced by the light source 2 reaches the surface of the photosensitive paper 6. Therefore, if the sensitivity of the paper 6 is relatively low, the system requires the light source 2 to have a relatively large capacity, to assure a sufficient intensity of the radiation. Further, the photosensitive paper 6 should be fed at a relatively low rate. In the system of FIG. 5, the intensity of the laser emitted from the laser scanner device 9 is generally not high enough to sufficiently expose the photosensitive paper 6. Hence, the photosensitive paper 6 cannot be fed at a high speed, unless the sensitivity of the paper 6 is considerably high.

In an attempt to solve the above drawbacks, an image recording apparatus as shown in FIG. 6 has been proposed. This apparatus uses a xerography unit 15 which includes a photosensitive drum 16, an electrostatic charger 17, a first exposing device 18, a first developing device 19, a cleaning device 20 and a discharger 21. The photosensitive drum 16 has an outer circumferential surface to which a toner is applied by the first developing device 19, whereby a visible light-shielding image is formed on the surface of the drum 16. The thus formed visible light-shielding image is transferred to a rotating transparent endless film 22 made of an electrically insulating material. The transferred light-shielding image on the endless film 22 is used as a photomasking pattern through which the photosensitive paper 6 is exposed by a second exposing device 23. Thus, the latent image corresponding to the photomasking pattern is formed on the photosensitive paper 6, and is subsequently developed by the second developing device 8 as used in the recording systems of FIGS. 4 and 5. The toner forming the light-shielding image or photomasking pattern is removed from the transparent endless film 22 by a cleaning device 24, so that the cleaned length is again used for the next image reproduction cycle.

In the image recording apparatus shown in FIG. 6, a considerable portion of the radiation produced by the second exposing device 23 can be effectively utilized to expose the photosensitive paper 6. Consequently, the paper 6 can be fed at a comparatively high rate, even where the sensitivity of the paper 6 is relatively low.

However, the recording apparatus of FIG. 6 also suffers from some drawbacks. Namely, a variation in the thickness of the endless film 22, a poor contact of the endless film with the photosensitive paper 6, an entry of dust between the film and paper 22, 6, may cause unsatisfactory sharpness of the latent image formed on the paper 6, since the paper 6 is exposed to the radiation through the photomasking pattern on the endless film 22. Further, the present known apparatus requires a complicated mechanism for feeding both the endless film 22 and the photosensitive paper 6, which increases the frequency of maintenance service of the apparatus as a whole.

SUMMARY OF THE INVENTION

It is therefore an object of the present invention to provide an improved image recording apparatus which is simple in construction, easy to maintain, and efficient in operation while ensuring sufficient sharpness of images formed on a photosensitive recording medium.

The above object can be attained according to the principle of the present invention, which provides an image recording apparatus, comprising: (a) pattern forming means for forming a light-shielding pattern on one of opposite surfaces of a photosensitive recording medium, the light-shielding pattern being formed of a light-shielding material which is capable of shielding a radiation; (b) exposing means for irradiating the above-indicated one surface of the photosensitive recording medium with the radiation, and thereby forming an optical latent image which corresponds to the light-shielding pattern; (c) cleaning means for removing the light-shielding pattern from the recording medium after the optical latent image is formed; and (d) developing means for developing the optical latent image into a visible image.

In the image recording apparatus of the present invention constructed as described above, a light-shielding pattern corresponding to a desired image to be reproduced or recorded is first formed directly on the photosensitive recording medium, and then the medium is exposed to a radiation through the light-shielding pattern. As a result, a latent image corresponding to the light-shielding pattern is formed, with the light-shielding pattern functioning as a photomask. Since this light-shielding or photomasking pattern is formed directly on the photosensitive recording medium, the latent image and the corresponding visible image formed by development of the latent image faithfully represent the source image. That is, the sharpness of the finally obtained visible image is considerably improved.

Further, since the instant apparatus does not require the use of a medium such as the endless film 22 of FIG. 6 for supporting a light-shielding pattern, the apparatus does not need a mechanism for moving such a film or other pattern supporting medium. Accordingly, the apparatus is simple and compact in construction, and is durable in operation.

According to one feature of the present invention, the photosensitive recording medium includes a photosensitive layer sensitive to the radiation, and a translucent layer having the above-indicated one surface, and the pattern forming means includes: optical pattern-forming means for irradiating the translucent layer of the recording medium with light according to image information representative of the light-shielding pattern, and thereby forming a preliminary latent image on the one surface of the translucent layer. The light is incapable of exposing the photosensitive layer of the recording medium to form the optical latent image. The pattern forming means further comprises means for applying the light-shielding material to the above-indicated one surface of the translucent layer, so as to form as the light-shielding pattern a visible photomasking pattern corresponding to the preliminary latent image.

In one form of the above feature of the invention, the translucent layer of the recording medium includes a transparent electrically conductive layer formed on the photosensitive layer, and a transparent photoconductive layer formed on the electrically conductive layer, and the optical pattern-forming means includes means for grounding the transparent electrically conductive layer; a charger disposed opposite to the transparent photoconductive layer, for electrostatically charging an entire surface area of the photoconductive layer; and another exposing means for irradiating the photoconductive layer with the light, and thereby discharging an electrostatic charge from local portions of the entire surface area of the photoconductive, layer, so as to form an electrostatically discharged pattern as the preliminary latent image.

According to another feature of the invention, the pattern forming means includes preliminary-image forming means, and electrostatic-pattern forming means. The preliminary-image forming means comprises: an electrode disposed opposite to the other of the opposite surfaces of the photosensitive recording medium; and an electrostatic head disposed opposite to the above-indicated one surface of the recording medium such that the recording medium is disposed between the electrode and the electrostatic head. The electrostatic head is operable according to image information representative of the light-shielding pattern, for forming an electrostatic preliminary latent image on the above-indicated one surface of the recording medium. Further, the electrostatic-pattern forming means is operable to apply the light-shielding material to the above-indicated one surface of the recording medium, so as to form as the light-shielding pattern a visible photomasking pattern corresponding to the electrostatic preliminary latent image.

In accordance with a further feature of this invention, the photosensitive recording medium comprises a photosensitive and magnetizable medium sensitive to the radiation, and the light-shielding material is a magnetized light-shielding material, and the pattern forming means includes preliminary-image forming means, and magnetic-pattern forming means. The preliminary-image forming means comprises a magnetic head operable according to image information representative of the light-shielding pattern, for forming a magnetic preliminary latent image on the recording medium. Further, the magnetic-pattern forming means is operable to apply the magnetized light-shielding material to the one surface of the recording medium, so as to form the light-shielding pattern corresponding to the magnetic preliminary latent image.

In accordance with a still further feature of the invention, the pattern forming means comprises: a bearing medium for bearing a visible photomasking pattern; means for applying the light-shielding material to the bearing medium, so as to form the visible photomasking pattern; and means for transferring the visible photomasking pattern from the bearing medium to the above-indicated one surface of the recording medium, and thereby forming the light-shielding pattern on the one surface.

In one form of the above feature of the invention, the light-shielding material is an electrostatically charged light-shielding material, and the pattern forming means further comprises electrostatic latent-image forming means for forming an electrostatic preliminary latent image on the bearing medium. In this case, the electrostatically charged light-shielding material is electrostatically applied to the bearing medium, to thereby form the visible photomasking pattern corresponding to the electrostatic preliminary latent image. Preferably, the bearing medium includes an electrically conductive body, and a photoconductive layer formed on the conductive body, and the electrostatic latent-image forming means comprises: a charger for electrostatically charging an entire surface area of the photoconductive layer; and another exposing means for irradiating the photoconductive layer with light, and thereby discharging an electrostatic charge from local portions of the entire surface area of the photoconductive layer, so as to form the electrostatic preliminary latent image.

In another form of the same feature of the invention, the bearing medium consists of an image-bearing drum having an outer circumferential surface on which the the visible photomasking pattern is formed. In this case, the image recording apparatus may comprise an image-transfer drum having an outer circumferential surface which supports the photosensitive recording medium. The image-bearing and the image-transfer drums are rotated in opposite directions to feed the recording medium therebetween, so as to transfer the visible photomasking pattern from the outer circumferential surface of the image-bearing drum to the recording medium supported on the image-transfer drum.

In a further form of the same feature of the invention, the light-shielding material is a magnetized light-shielding material, and the pattern forming means further comprises magnetic latent-image forming means for forming a magnetic preliminary latent image on the bearing medium. In this case, the magnetized light-shielding material is magnetically applied to the bearing medium to thereby form the visible photomasking pattern corresponding to the magnetic preliminary latent image. The bearing medium may include a magnetic material, and the magnetic latent-image forming means comprises a magnetic head operable to magnetize local portions of the bearing medium according to the image information.

According to a yet further feature of the invention, the image recording apparatus further comprises a drum having an outer circumferential surface for supporting the photosensitive recording medium, and supported rotatably to feed the recording medium in a rotating direction thereof, and the pattern forming means, the exposing means and the cleaning means are disposed around the drum, so as to face different portions of the outer circumferential surface of the drum.

In one form of the above feature of the invention, the recording medium is wound as a roll disposed within the drum. The drum has an outlet through which the recording medium extends from the roll onto the outer circumferential surface.

According to still another feature of the present invention, the image recording apparatus further comprises means for reciprocating the recording medium past the pattern forming means, the exposing means and the cleaning means, and the pattern forming means is operable to form a plurality of light-shielding patterns corresponding to a plurality of colors. The photosensitive medium is sensitive to a plurality of radiations, and the exposing means is operable to irradiate the recording medium with the plurality of radiations, through the plurality of light-shielding patterns, respectively, to thereby form on the recording medium the visible image in the plurality of colors.

According to yet another feature of the invention, the pattern forming means comprises: a developing roll having an outer circumferential surface for applying a toner as the light-shielding material to the above-indicated one surface of the recording medium; and means for applying selectively a positive or negative voltage to the developing roll. The toner is applied to the recording medium when one of the positive and negative voltages is applied to the developing roll, while the toner is removed from the recording medium when the other of the positive and negative voltages is applied to the developing roll, whereby the pattern forming means also serves as the cleaning means.

According to another aspect of the present invention, there is provided a photosensitive recording medium comprising a photosensitive layer sensitive to a radiation, a translucent electrically conductive material formed on the photosensitive layer, and a translucent photoconductive layer formed on the translucent electrically conductive material. The photoconductive layer is normally dielectric and which is electrically conductive upon exposure thereof to a radiation.

According to a further aspect of this invention, there is provided a photosensitive recording medium comprising a photosensitive material and a magnetic material over an entire area thereof. This photosensitive recording medium may comprise a photosensitive layer which includes the photosensitive material, and a translucent magnetic layer which is formed on the photosensitive layer and which includes the magenetic material.

BRIEF DESCRIPTION OF THE DRAWINGS

The above and other objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
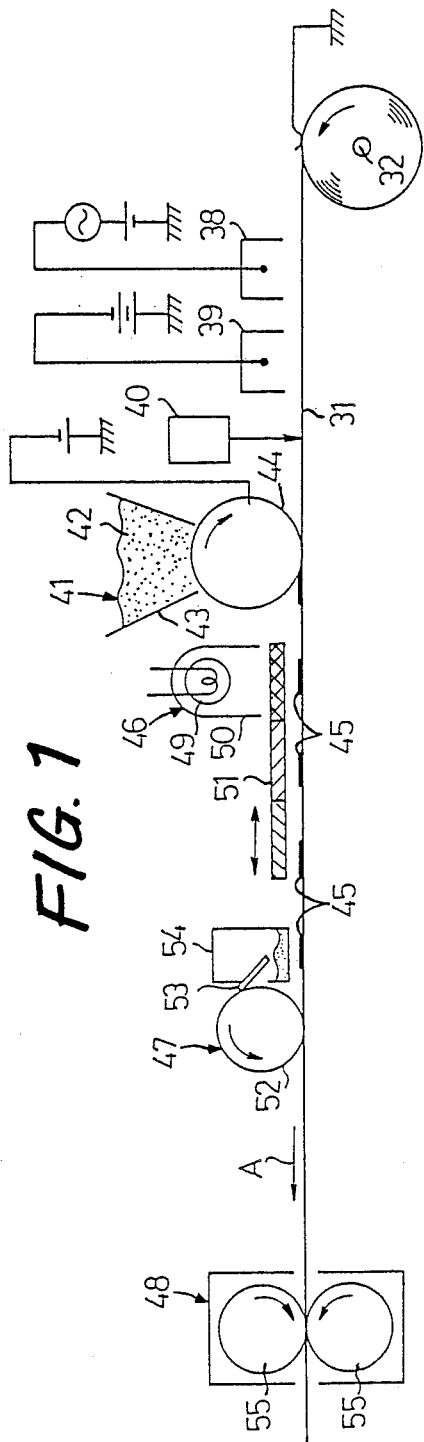
FIG. 1 is a schematic view of one embodiment of an image recording apparatus of the invention in the form of a color-imaging system.
Figure 2:
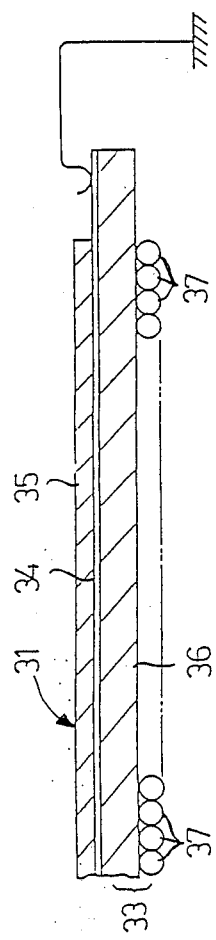
FIG. 2 is an enlarged fragmentary elevational view in cross section of a photosensitive paper used for the recording apparatus of FIG. 1.
Figure 3:
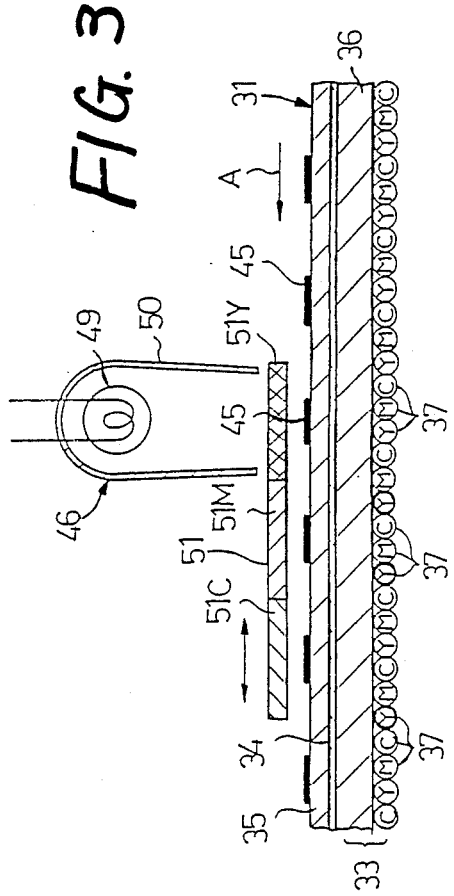
FIG. 3 is an enlarged fragmentary elevational view in cross section of a second exposing device of the recording apparatus.

Referring first to FIGS. 1, 2 and 3, a photosensitive recording medium in the form of a color-imaging photosensitive paper 31 is fed in a horizontal direction from a supply roll 32, along a predetermined feed path. As illustrated in FIGS. 2 and 3, the photosensitive paper 31 has a laminar structure which consists of a photosensitive layer 33, a transparent electrically conductive layer 34 formed on the photosensitive layer 33, and a transparent photoconductive layer 35 formed on the layer 34. As shown in FIG. 2, the photosensitive layer 33 includes a transparent base 36 made of a resin material, and a layer of microcapsules 37 each of which contains a chromogenic material and a radiation-curable resin. The microcapsules 37 consist of three types C, M and Y as indicated in FIG. 3, which contain different chromogenic materials for three complementary colors, cyan, magenta and yellow, of the three primary colors of light. The photosensitive layer 33 further includes a developer layer (not shown) formed of a developing material which reacts with the chromogenic materials of the microcapsules 37, to produce the colors of cyan, magenta and yellow, when the photosensitive paper 31 is developed as described later. The transparent electrically conductive layer 34 of the photosensitive paper 31 is connected to the earth.

Referring back to FIG. 1, there are disposed along the feed path of the photosensitive paper 31 an electrostatic discharger 38, an electrostatic charger 39, optical pattern-forming means in the form of a first exposing device 40, and a first developing device 41 which serves as first developing means for applying a light-shielding material in the form of an electrostatically charged toner 42. These elements 38-41 are arranged in the order of description in the feeding direction of the paper 31, in mutually spaced-apart relation. As the photosensitive paper 31 is fed, the photoconductive layer 35 is electrostatically discharged, and then electrostatically charged. Subsequently, the upper surface of the transparent photoconductive layer 35 is irradiated with light emitted by the first exposing device 40, according to image information representative of a desired source image to be recorded or reproduced. Described more specifically, the first exposing device 40 is operated so as to discharge those portions of the photoconductive layer 35 which correspond to dark portions (e.g., black or printed portions) of the source image. Thus, a preliminary latent image corresponding to the source image is electrostatically formed on the surface of the photoconductive layer 35, such that the electrostatically charged portions correspond to the light or bright portions (white or non-printed portions) of the source image. It will be understood that the photosensitive layer 33 is not sensitive to the light emitted by the first exposing device 40. In other words, the device 40 is not capable of exposing the microcapsules 37 of the photosensitive layer 33.

The first developing device 41 includes a toner container 43 which accommodates a mass of the electrostatically chargeable black toner 42, and a developing roll 44 which is rotated in contact with the toner mass 42. When the toner 42 is fed from the container 43 by the developing roll 44, the toner 42 is charged with the same polarity as that of the charged portions of the photoconductive layer 35 which correspond to the light portions of the source image. The developing roll 44 is adapted to apply the charged toner 42 to the upper surface of the photoconductive layer 35. More particularly, the toner is repelled by the charged portions of the layer 35 which correspond to the light portions of the source image, and is attracted to the non-charged portions of the layer 35 which correspond to the dark portions of the source image. Accordingly, a visible light-shielding pattern 45 of the black toner 42 corresponding to the electrostatic preliminary latent image is formed on the photoconductive layer 35. The toner 42 is capable of shielding a radiation produced by a second exposing device 46 which will be described.

In the present embodiment, the first exposing device 40 is adapted to expose the portions of the photoconductive layer 35 corresponding to the dark portions of the source image, so that the exposed portions of the photoconductive layer 35 are electrostatically discharged, and the toner 45 is attracted by these discharged portions of the layer 35, as described above. However, the first exposing device 40 may be operated to expose the portions of the layer 35 corresponding to the light portions of the source image, so that the non-exposed portions of the layer 35 corresponding to the dark portions of the source image remain electrostatically charged. In this case, the toner 42 is electrostatically charged with the polarity opposite to that of the charged portions of the layer 35 so that the toner 42 is attracted by the charged portions of the layer 35.

The second exposing device 46 indicated above is disposed next to the first developing device 41 in the feeding direction of the photosensitive paper 31. Following the second exposing device 46, there are disposed a cleaning device 47, and a second developing device 48, in the order of description. The second exposing device 46 includes an illuminating lamp 49, a collector 50, and an inteference filter 51. The filter 51 consists of a cyan filter 51C which transmits only the light having a wavelength corresponding to cyan, a magenta filter 51M which transmits only the light having a wavelength corresponding to magenta, and a yellow filter 51Y which transmits the light having a wavelength corresponding to yellow. These filters 51C, 51M and 51Y are selectively brought into an operating position on the light path between the lamp 49 and the exposing point on the upper surface of the photosensitive paper 31. Thus, the photosensitive layer 33 is irradiated with the radiation from the lamp 49, through the respective filters 51C, 51M and 51Y, the light-shielding pattern 45 and the transparent layers 35, 34. Since the light-shielding pattern 45 serves as a photomasking pattern, the radiation-curable resin in the microcapsules 37 in the exposed portions of the layer 33 which are not covered by the light-shielding toner 42 of the pattern 45 is cured, while the resin in the microcapsules 37 in the portions of the non-exposed portions of the layer 33 covered by the light-shielding toner 42 is left uncured. Thus, a latent image corresponding to the light-shielding or photomasking pattern 45 is optically formed on the photosensitive layer 33 of the paper 31.

The cleaning device 47 includes a magnet roller 52 for attracting the toner 42 of the pattern 45 on the photoconductive layer 35, a cleaning blade 53 to remove the toner from the roller 52, and a recovery casing 54 for storing the removed toner 42. Thus, the photoconductive layer 35 is cleaned before the photosensitive paper 31 enters the second developing device 48.

The second developing device 48 has a pair of pressure rollers 55 which are rotated in the opposite directions, in contact with each other. These rollers 55 are supported so that the two rollers may be moved away from each other. The cleaned photosensitive paper 31 on which the optical latent image has been formed is passed through the nip of the pressure rollers 55. As a result, the microcapsules 37 whose radiation-curable resin is left uncured are ruptured, whereby the chromogenic material which has come out of the ruptured microcapsules 37 reacts with the developing material. In this manner, the latent image formed on the photosensitive layer 33 is developed into a corresponding visible image, which corresponds to the source image represented by the source image information according to which the first exposing means 40 is operated to form the preliminary latent image that is developed into the light-shielding or photomasking pattern 45 by the first developing device 41.

There will be described a color imaging operation on the image recording apparatus constructed as described above.

In the present example, three different light-shielding patterns 45 and the corresponding latent images for yellow, magenta and cyan are formed on the photosensitive paper 31 in the order of description. Initially, the visible light-shielding pattern 45 formed of the black toner 42 for the yellow color is formed on the photoconductive layer 35 by the first exposing and developing devices 40, 41, while the paper 31 is fed in the direction A indicated in FIG. 1. The photosensitive layer 33 is then irradiated by the radiation produced by the lamp 49, through the yellow filter 51Y placed in its operating position, and through the light-shielding or photomasking pattern 45 formed on the photoconductive layer 35. Consequently, the exposed microcapsules 37(Y) sensitive to the incident radiation for the yellow color are cured, while the microcapsules 37(Y) covered by the light-shielding pattern 45 are left uncured, whereby the latent image corresponding to the yellow dots of the source image is formed by the ruptured and unruptured microcapsules 37(Y). Subsequently, the light-shielding pattern 45 is removed by the cleaning device 47. Then, the photosensitive paper 31 is fed back while being rewound on the supply roll 32, until the leading end of the exposed length of the photosensitive paper 31 (on which the latent image for the yellow color has been formed) reaches the electrostatic discharger 38.

In the same manner as described above, the light-shielding patterns 45 for the magenta and cyan colors are formed on the photoconductive layer 35 by the first exposing and developing devices 40, 41, and the corresponding latent images are formed on the photosensitive layer 33 by the second exposing device 46 with the appropriate filters 51M and 51C placed in the operating position. After the latent image for the magenta color is formed, the photosensitive paper 31 is again returned back to the electrostatic discharger 38, and the latent image for the cyan color is formed. After the three latent images for the yellow, magenta and cyan colors have been formed on the photosensitive layer 33, the paper 31 is passed through the pressure nip of the pressure rollers 55 of the second developing device 48. As a result, the uncured microcapsules 37(Y), 37(M) and 37(C) are ruptured, and the chromogenic materials come out of the ruptured microcapsules 37 and react with the developing material included in the photosensitive layer 33, whereby a visible color image corresponding to the source color image is produced on the photosensitive paper 31.

Figure 6:
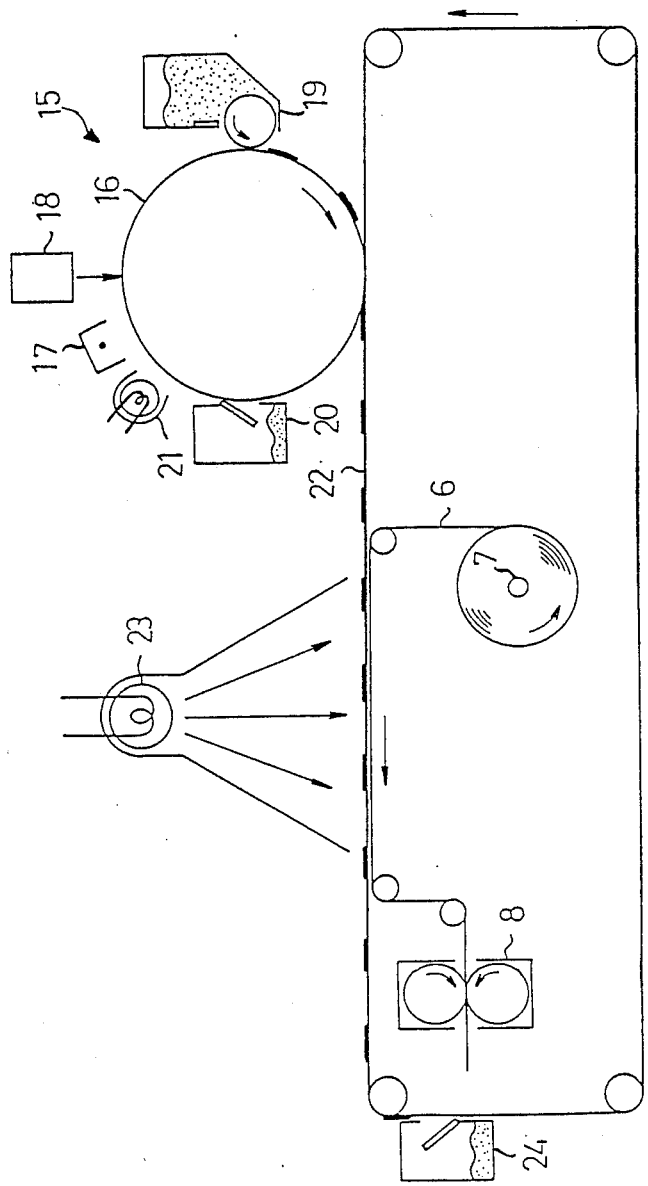

It follows from the foregoing description that the light-shielding pattern 45 for each color is formed directly on the photosensitive paper 31, more precisely on the surface of the photoconductive layer 35, and the photosensitive layer 33 is irradiated through the thus formed light-shielding pattern 45, to form the corresponding latent image, which is eventually developed into the corresponding visible color image. Therefore, the instant image recording apparatus does not require a separate film as indicated at 22 in FIG. 6, for supporting the light-shielding pattern 45. Consequently, the instant apparatus does not require a mechanism for feeding such a film. Further, the sharpness of the finally obtained visible image is increased due to the formation of the light-shielding pattern 45 directly on the photosensitive paper 31, which eliminates otherwise possible variation in the distance between the pattern 45 and the photosensitive layer 33, as experienced on the known apparatus of FIG. 6.

Figure 7:
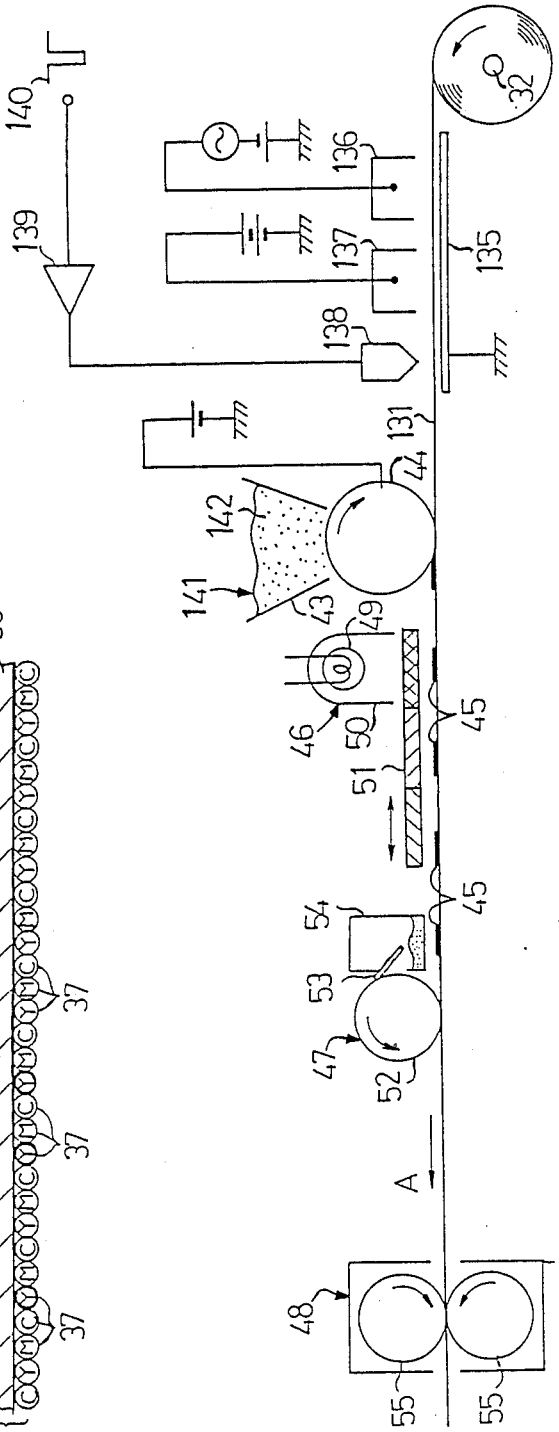
FIG. 7 is a schematic view of another embodiment of the present invention.
Figure 8:
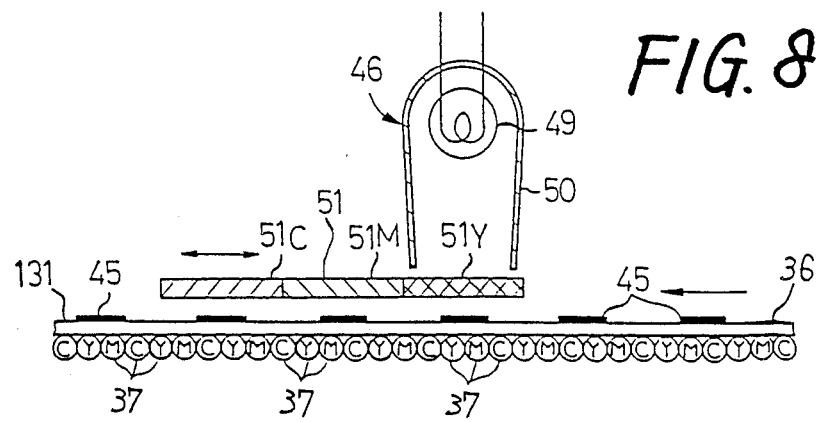
FIG. 8 is an enlarged view in cross section of a second exposing device and a photosensitive paper used in the embodiment of FIG. 7.

Referring next to FIG. 7 and 8, a second embodiment of the image recording apparatus of the invention will be described. In the present modified embodiment and subsequent modified embodiments, the same reference numerals as used in the preceding embodiment or embodiments will be used to identify the corresponding components. In the interest of brevity and simplification, redundant description of these components is avoided as much as possible.

The present modified apparatus uses a color imaging photosensitive paper 131, which is fed bidirectionally in the horizontal direction from and to the supply roll 32, as in the preceding embodiment. This photosensitive paper 131 is different from the photosensitive paper 31 used in the first embodiment, in that the paper 131 does not include transparent electrically conductive and photoconductive layers as indicated at 34 and 35 in FIGS. 2 and 3. The photosensitive paper 131 has the microcapsules 37 for the cyan, magenta and yellow colors and the developer layer (not shown) which are formed on the transparent base 36, as in the first embodiment.

As shown in FIG. 7, a planar electrode 135 is disposed a short distance below the photosensitive paper 131, such that the electrode 135 is opposite to the lower surface of the paper 131. The electrode 135 is grounded. Above the length of feed path of the paper 131 corresponding to the length of the electrode 135, an electrostatic discharger 136, an electrostatic charger 137, and an electrostatic head 138 are arranged in this order in the feeding direction of the paper 131. The planar electrode 135 and the electrostatic head 138 cooperate with each other to constitute means for forming an electrostatic preliminary latent image on the photosensitive paper 131.

The photosensitive paper 131 which has been electrostatically discharged by the discharger 136 is electrostatically charged by the charger 137 with the polarity opposite to that of the charger 39 of the first embodiment. The electrostatic head 138 is connected to an amplifier 139, which is adapted to receive an image signal 140 indicative of image information representing a desired source image. The electrostatic head 138 is operated according to the image signal 140, so that the portions of the paper 131 corresponding to the dark portions of the source image are electrostatically discharged through the electrode 135, while the portions of the paper 131 corresponding to the light portions of the source image remain electrostatically charged. Thus, an electrostatic latent image corresponding to the source image is formed on the photosensitive paper 131.

Adjacent to the electrostatic head 138, there is disposed a first developing device 141 which uses an electrostatically chargeable black toner 142. When the toner 142 is supplied by the developing roll 44, the toner 142 is electrostatically charged with the same polarity as that of the charged portions of the paper 131, i.e., the same polarity as that of the electrostatic charge produced by the charger 137. Accordingly, the toner 142 is repelled by the charged portions of the paper 131 which correspond to the white or light portions of the source image, while the toner 142 is attracted by the non-charged portions of the paper 131 corresponding to the black or dark portions of the source image. In this embodiment, therefore, the toner 142 is electrostatically charged with the polarity opposite to that of the toner 42. However, the charger 137 may be eliminated, if the electrostatic head 138 is adapted to electrostatically charge the portions of the paper 131 corresponding to the dark portions of the source image. In this case, the toner 142 is electrostatically charged with the polarity opposite to that of the charged portions of the paper 131.

The present second embodiment uses the exposing device 46, cleaning device 47 and second developing device 48 which have been described above.

In this second embodiment of FIGS. 7 and 8, too, the light-shielding or photomasking pattern 45 is formed directly on the photosensitive paper 131, by the first developing device 141, and the corresponding latent image is optically formed on the photosensitive paper 131, by the exposing device 46. The latent image is then developed into a visible image by the developing device 48.

Figure 9:
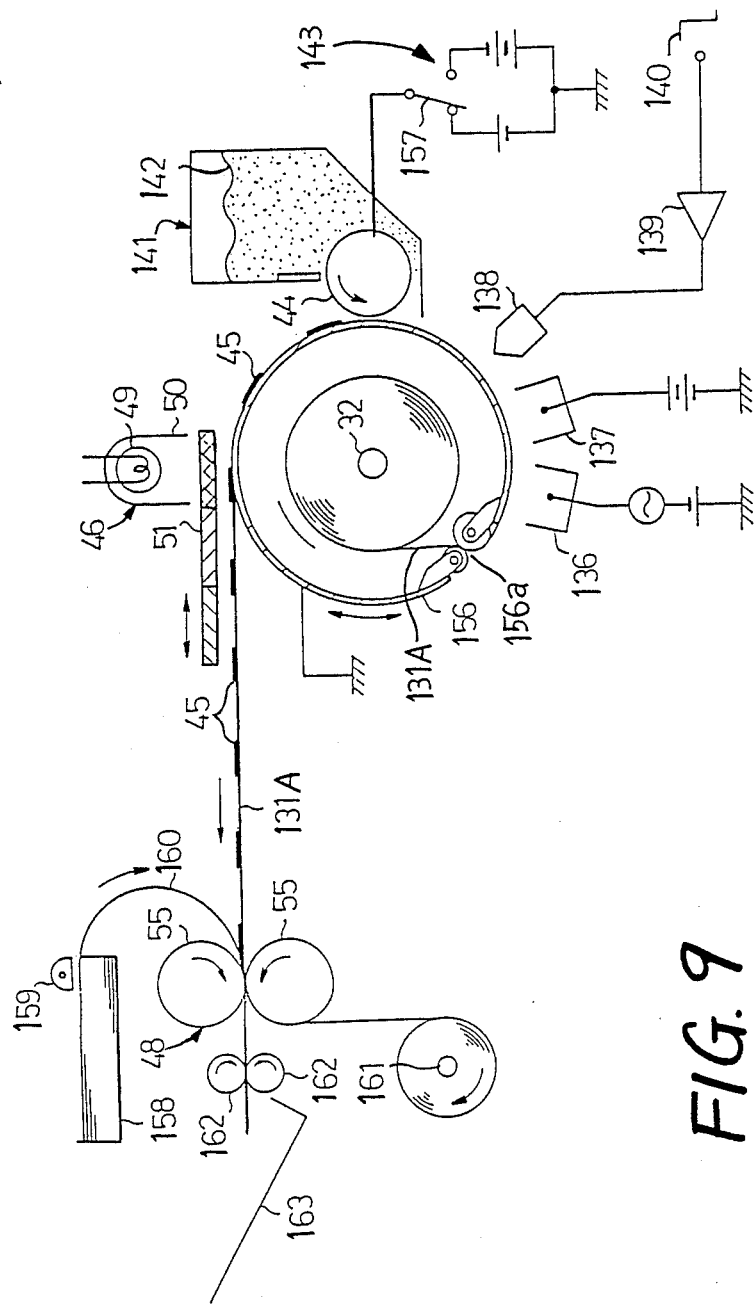
FIG. 9 is a schematic view of a further embodiment of the invention.

Reference is now made to FIG. 9, which shows a third embodiment of the invention, wherein a photosensitive paper 131A is supplied from the supply roll 32, which is accommodated within a paper holder drum 156 which is made of an electrically conductive material and is grounded. The photosensitive paper 131A is different from the photosensitive paper 131 used in the second embodiment, in that the paper 131A does not include a developing material. In the present third embodiment, the developing material is provided in the form of a developer sheet 160 which will be described. The supply roll 32 and the paper holder drum 156 are both rotatably supported, and these two members 32, 156 are rotatable relative to each other. The drum 156 has an outlet 156a formed through its cylindrical wall, so that the photosensitive paper 131A may extends from the roll 32 through the outlet 156a, onto the outer circumferential surface of the drum. As indicated in FIG. 9, the photosensitive paper 131A extends from the drum 156 in the horizontal direction toward the second developing device 48. The discharger 136, charger 137, electrostatic head 138, first developing device 141 and exposing device 46 are disposed around the drum 156, in the order of description, as viewed in the counterclockwise direction in FIG. 9.

In the present modified embodiment, the developing roll 44 of the first developing device 141 is connected to a power supply 143 through a development-cleaning selector switch 157, so that the device 141 serves not only as the developing device for applying the charged toner 142 to the photosensitive paper 131A wound on the outer surface of the drum 156, but also as an erasing device for removing the toner 142 from the photosensitive paper 131A. The photosensitive paper 131A is initially fed with the paper holder drum 156 rotated in the counterclockwise direction as seen in FIG. 9, while the selector switch 157 is placed in the developing position. As the paper 131A is fed, the electrostatic preliminary latent image for the yellow color, for example, is formed by the electrostatic head 138, and the corresponding visible photomasking pattern 45 is formed by the first developing device 141. Then, the latent image corresponding to the photomasking pattern 45 is optically formed by the exposing device 46. Then, the photosensitive paper 131A is fed back with the drum 156 rotated in the clockwise direction, while the selector switch 157 is placed in the cleaning position. Thus, the paper 131A is cleaned. Similarly, the optical latent images for the magenta and cyan colors may be formed on the photosensitive paper 131A.

The developer sheets 160 are fed from a sheet storage 158 by a feed roller 159, such that each sheet 160 is superposed on the exposed length of the photosensitive paper 131A. The superposed sheet 160 and paper 131A are passed through the nip of the pressure rollers 55 of the second developing device 48. As a result, the chromogenic materials which have come out of the ruptured microcapsules 37(Y), 37(M) and 37(C) on the paper 131A react with the developing material of the developer sheet 160, whereby a visible image corresponding to the latent image optically formed by the exposing device 46 is formed on the developer sheet 160. The leading portion of the photosensitive paper 131A is wound on a take-up roller 161, while the developer sheet 160 on which the visible image has been formed is ejected through the nip of guide rollers 162, onto a receiver tray 163. In this third embodiment, too, the visible image can be formed with a sufficiently high degree of sharpness, since the light-shielding pattern 45 is directly formed on the photosensitive paper 131A.

Figure 11:
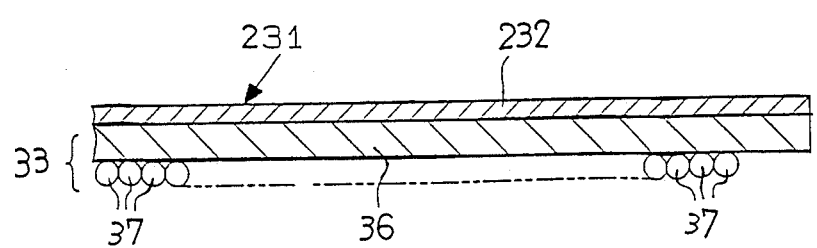
FIG. 11 is an enlarged view in cross section of a photosensitive paper used in the embodiment of FIG. 10.
Figure 10:
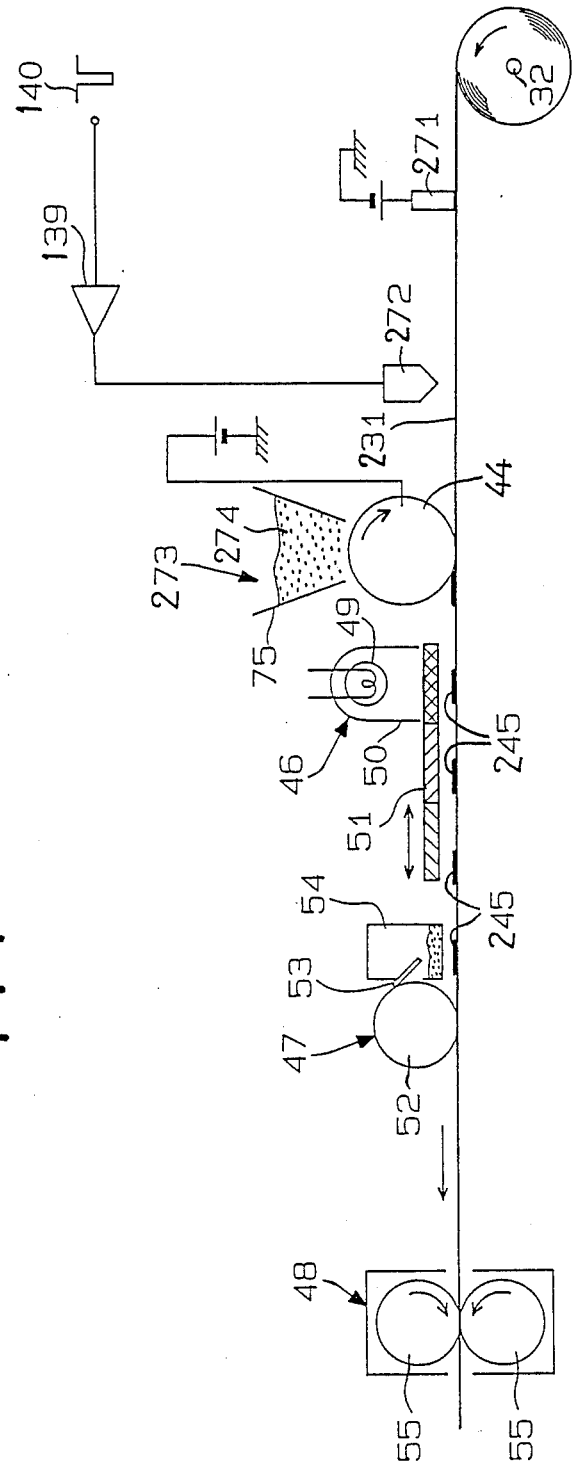
FIG. 10 is a schematic view of a still further embodiment of the invention.

Referring next to FIGS. 10 and 11, a fourth embodiment of the invention will be described.

This modified color imaging apparatus uses a photosensitive paper 231 which includes the photosensitive layer 33 as shown in FIGS. 2 and 3, and a transparent magnetic layer 232 formed on the transparent base 36 of the photosensitive layer 33, as depicted in FIG. 11. Further, the present embodiment uses preliminary image-forming means in the form of a magnetic head 272 for forming a magnetic preliminary latent image on the magnetic layer 232 of the photosensitive paper 231. Namely, the preliminary latent image is formed by magnetography.

Between the supply roll 32 of the photosensitive paper 231 and the magnetic head 272, there is disposed a demagnetizer 271 for demagnetizing the magnetic layer 232 before the layer 232 is locally magnetized by the magnetic head 272. A first developing device 273 is disposed in spaced-apart relation with the magnetic head 272, in the feeding direction of the paper 231. The magnetic head 272 is connected to the amplifier 139 which receives the image signal 140, as described above. The magnetic head 272 is operated according to the image signal representative of a source image to be reproduced, so that a magnetic preliminary latent image corresponding to the source image is formed on the magnetic layer 232 of the photosensitive paper 231. The first developing device 273 uses a magnetizable black toner 274 stored in the container 75. This toner is capable of shielding a radiation. When the black toner 274 is applied by the roll 44 onto the magnetic layer 232, the toner 274 is magnetized and is attracted by the magnetized or non-magnetized portions of the magnetic layer 232 of the photosensitive paper 231, depending upon the magnetic polarity of the magnetized toner 274 relative to the polarity of the magnetized portions of the magnetic layer 232. In any event, the toner 274 is attracted to the portions of the magnetic layer 232 which correspond to dark or colored portions of the source image. Thus, a light-shielding or photomasking pattern 245 corresponding to the magnetic preliminary latent image is formed by the first developing device 273, on the magnetic layer 232 of the photosensitive paper 231. This photomasking pattern 245 functions in the same manner as the photomasking pattern 45 formed in the preceding embodiments, and a latent image corresponding to the pattern 245 is optically formed by the exposing device 46. This optically formed latent image is developed into a sharp visible image by the second developing device 48. The obtained visible image owes its sharpness to the direct formation of the light-shielding pattern 245 on the photosensitive paper 231, as in the previous embodiments.

A fifth embodiment of the image recording apparatus of the invention will be described, referring to FIG. 12.

This embodiment uses the photosensitive paper 131A shown in FIG. 9. The paper 131A is fed at a suitable speed in the horizontal direction as shown in FIG. 12. Above the feed path of the photosensitive paper 131A, there is provided an image-bearing drum in the form of a photosensitive drum 335 which has a photoconductive outer circumferential surface. Around this drum 335, there are disposed a cleaning device 336, an electrostatic discharger 337, an electrostatic charger 338, latent-image forming means in the form of a first exposing device 339, and the first developing device 41 (as shown in FIG. 1). These members 336, 337, 338, 339 and 41 are arranged in the direction (clockwise direction in FIG. 12) of rotation of the photosensitive drum 335 for forming an electro-static preliminary latent image and a visible light-shielding or photomasking pattern 345, as described below.

Figure 12:
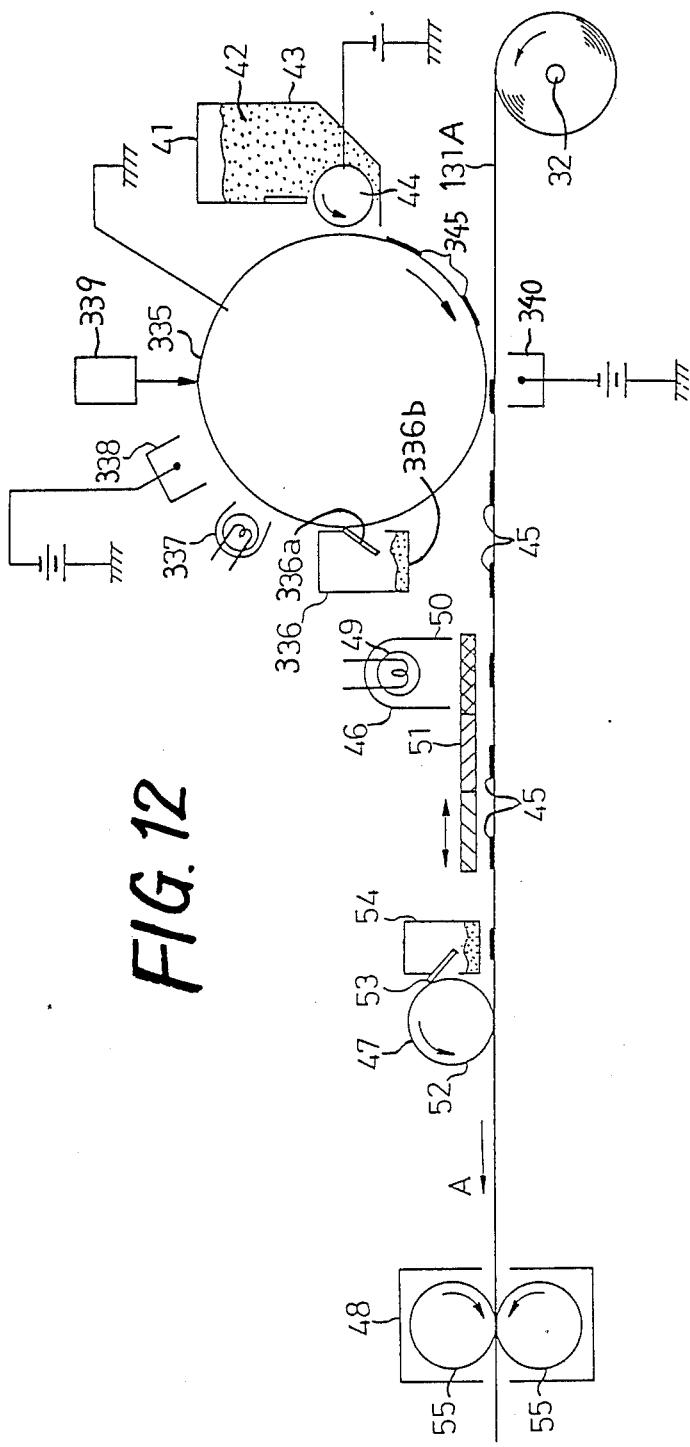
FIGS. 12 and 13 are views corresponding to those of FIGS. 1 and 3, showing a yet further embodiment of the invention.

As the drum 335 is rotated in the clockwise direction as indicated by an arrow in FIG. 12, a remnant of the toner 42 possibly remaining on the photoconductive outer surface of the drum 335 is removed by the cleaning blade 336a of the cleaning device 336, and the removed toner 42 is stored in a recovering casing 336b. Then, the photoconductive outer surface of the drum 335 is discharged by the electrostatic discharger 337, and is electrostatically charged before the surface is locally selectively electrostatically discharged by the first exposing device 339.

Figure 4:
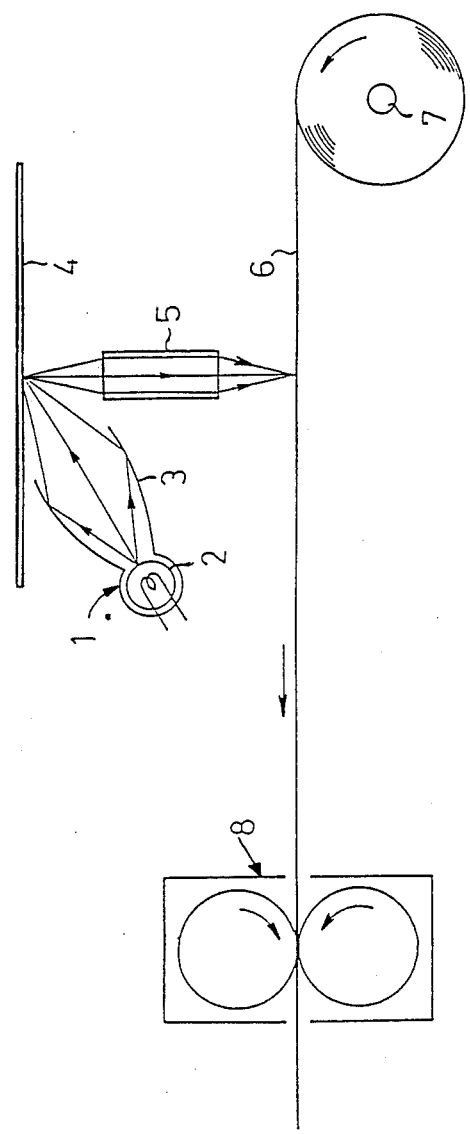
FIGS. 4, 5 and 6 are schematic views showing known image recording arrangements.

The first exposing device 339 is a well known device as shown in FIG. 4, which is operated to irradiate the electrostatically charged photoconductive outer circumferential surface of the drum 335, according to image information representative of a desired source image. More specifically, the portions of the electrostatically charged photoconductive surface of the drum 335 which correspond to the dark or colored portions of the source image are discharged, while the portions of the photoconductive surface which correspond to light or white portions of the source image remain electrostatically charged. When the electrostatically charged toner 42 is applied to the thus locally discharged photoconductive surface of the drum 335, the toner 42 is attracted by the electrostatically discharged portions of the drum surface, whereby a visible photomasking pattern 345 corresponding to the source image is formed on the photoconductive surface of the drum 335.

Below the feed path of the photosensitive paper 131A, an image transfer device 340 is disposed such that the photosensitive paper 131A travels between the drum 335 and the device 340. While the photosensitive paper 131A is fed in contact with or adjacent to the surface of the drum 335, the image transfer device 340 electrostatically charges the paper 131A with the polarity opposite to that of the electrostatically charged toner 42 of the photomasking pattern 345, whereby the photomasking pattern 345 is electrostatically attracted by the photosensitive paper 131A. Thus, the photomasking pattern 345 is transferred to the upper surface of the paper 131A, as the light-shielding pattern 45 through which the paper 131A is exposed to the radiation emitted from the second exposing device 46. After the light-shielding pattern 45 is removed by the cleaning device 47, the photosensitive paper 131A is fed back toward the supply roll 32. Thus, the optical latent image for each color (yellow, magenta and cyan) is formed on the photosensitive paper 131A.

Figure 5:
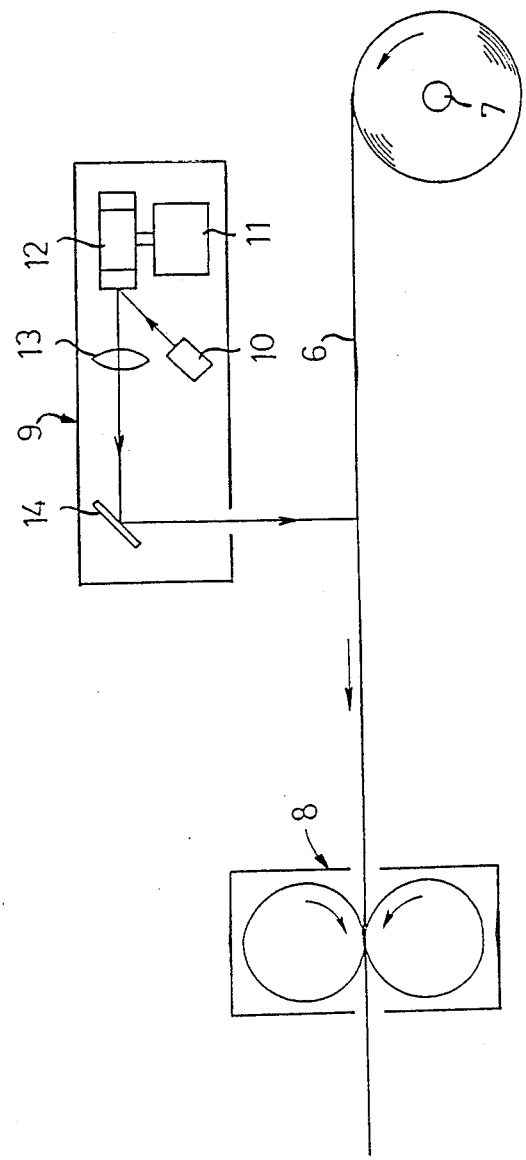
Figure 13:
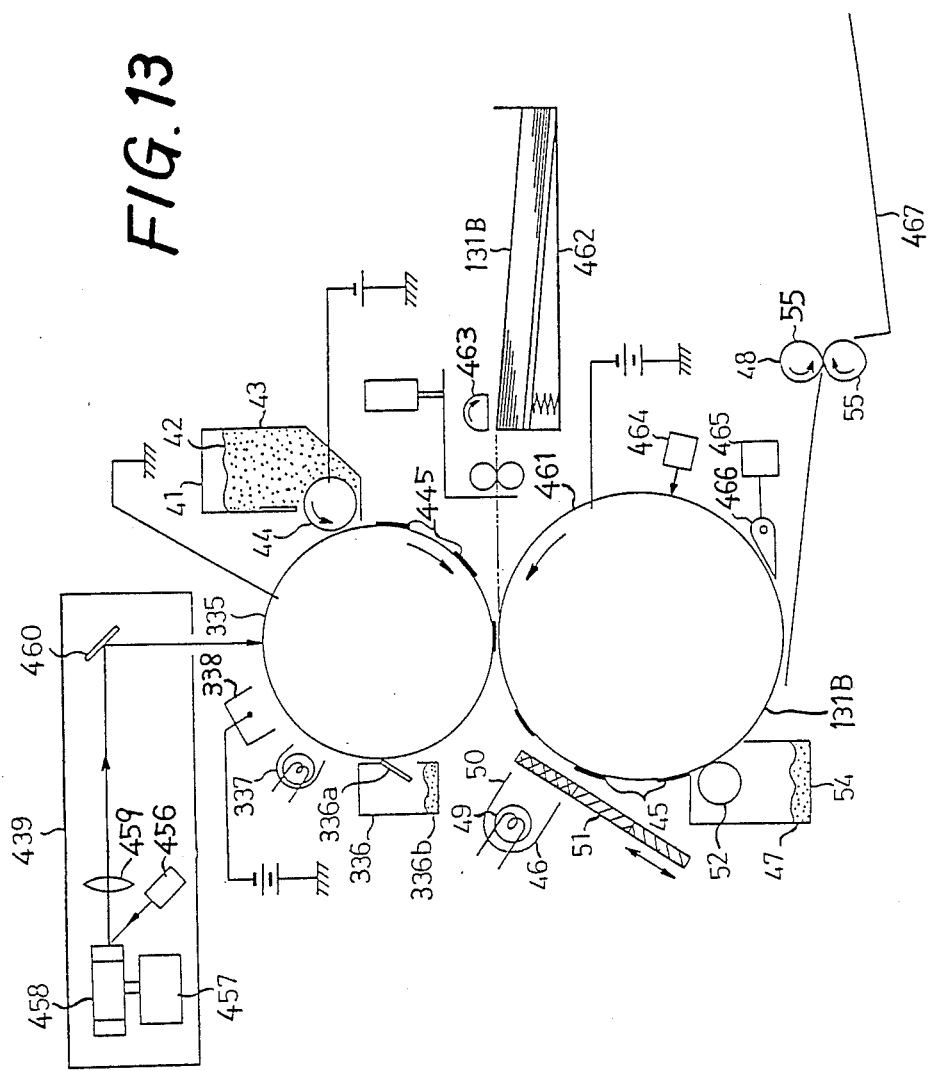

By reference to FIG. 13, there will be described a sixth embodiment of the invention also in the form of a color-imaging apparatus. This apparatus uses latent-image forming means in the form of a first exposing device 439 which is similar to a known laser scanning device as illustrated in FIG. 5. The exposing device 439 includes a semiconductor laser element 456 which produces a laser radiation. The laser is reflected by a polygon mirror 458 rotated by a motor 457, and the reflected laser travels through an f-θ lens 459 and is reflected by a reflector mirror 460. The laser reflected by the mirror 460 is incident upon the photoconductive surface of the image-bearing photosensitive drum 335.

The incident laser represents a desired source image, and the corresponding latent image is electrostatically formed on the photoconductive surface of the drum 335. Then, this electrostatic preliminary latent image is developed into a visible photomasking pattern 445 by the first developing device 41.

Adjacent to the image-bearing drum 335, there is disposed an image-transfer drum 461. This drum 461 is rotated about an axis parallel to the axis of rotation of the image-bearing drum 335. The instant recording apparatus uses a photosensitive paper in the form of cut sheets 131B stored in a sheet storage 462. The photosensitive cut sheet 131B is fed from the storage 462 by a feed roller 463, toward the nip of the image-bearing and image-transfer drums 335, 461. The photosensitive sheet 131B is electrostatically attracted by the circumferential surface of the image-transfer drum 461 while the two drums 335, 461 are rotated in the opposite directions to feed the sheet 131B through the nip of the drums. At this time, the photomasking pattern 445 for each color on the surface of the image-bearing drum 335 is transferred onto the photosensitive sheet 131B as the light-shielding pattern 45.

Around the image-transfer drum 461 which also functions to support the photosensitive sheet 131B, there are disposed the second exposing device 46 (as used in the first embodiment of FIG. 1), the cleaning device 47 (as used in the first embodiment), a sheet separator 466, and a sheet sensor 464. The sheet separator 466 is activated by a solenoid 465 to separate the photosensitive sheet 131B from the drum 461, so that the separated sheet 131B is fed toward the second developing device 48. The sheet sensor 464 is provided to detect the leading edge of the sheet 131B. The sheet 131B which has passed through the nip of the pressure rollers 55, 55 is received by a tray 467.

In this embodiment, too, the light-shielding pattern 45 is formed directly on the photosensitive sheet 131B, and therefore the visible image formed on the sheet 131B may have improved sharpness Further, the exposures of the photosensitive sheet 131B by the second exposing device 46 through the three light-shielding or photomasking patterns 45 for yellow, magenta and cyan are continuously effected while the sheet 131B held on the image-transfer drum 461 is continuously rotated in the same direction. Hence, it is not necessary to reciprocate the photosensitive recording medium (sheet 131B) as required in the preceding embodiments. Accordingly, the mechanism for controlling the movement of the photosensitive sheet 131B can be simplified, and the positioning of the sheet 131B can be readily accomplished.

Figure 14:
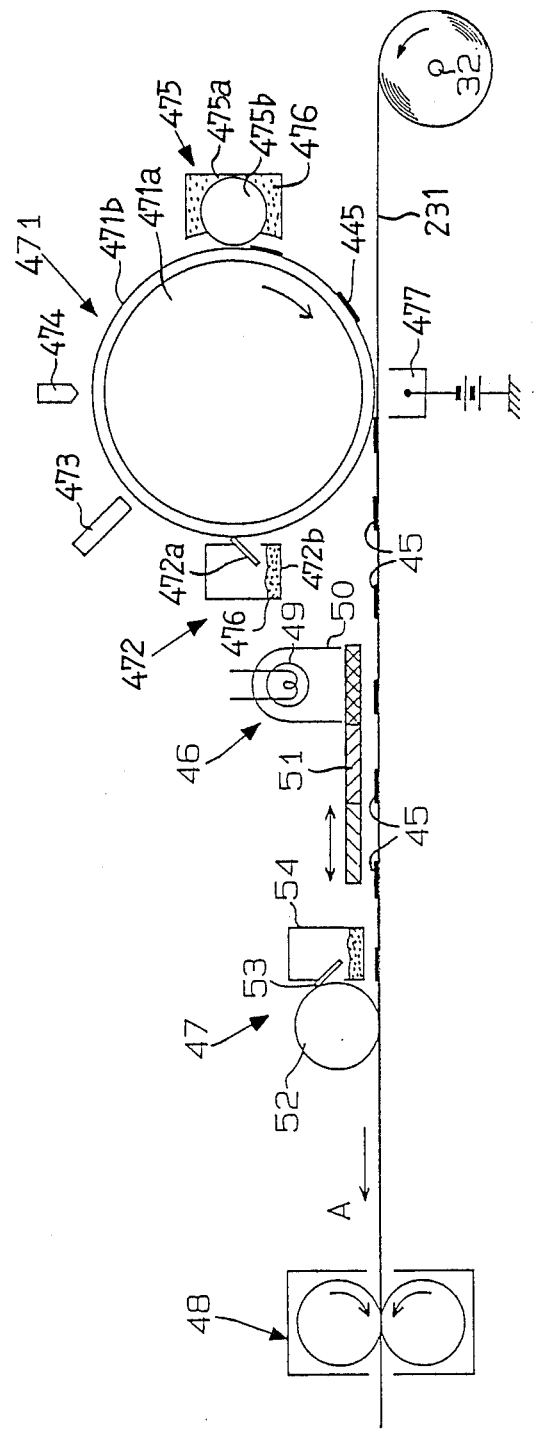
FIG. 14 is a schematic view illustrating still another embodiment of the invention.

Referring to FIG. 14, a seventh embodiment of the invention also in the form of a color-imaging apparatus will be described. This image recording apparatus employs an image-bearing drum in the form of a magnetic drum 471, and a magnetic head 474, in order to form a magnetic preliminary latent image by magnetography.

Described more specifically, the image-bearing magnetic drum 471 includes an aluminum cylindrical body 471a, and a magnetic layer 471b formed on the outer circumferential surface of the aluminum body. The magnetic layer 471b is made of a magnetic or magnetizable material.

Around the magnetic drum 471, there are disposed a cleaning device 472, a demagnetizer 473, the magnetic head 474, and a first developing device 475, which are arranged as a circulary array, in the order of description in the clockwise direction in FIG. 14. As the drum 471 is rotated in the clockwise direction, the circumferential magnetic layer 471b is demagnetized by the demagnetizer, and is then locally magnetized by the magnetic head 474, according to image information, whereby a magnetic preliminary latent image corresponding to a desired source image is formed on the magnetic layer 471b. This preliminary latent image is developed by the first developing device 475 into a visible photomasking pattern 445. This pattern 445 is formed of a magnetized black toner 476 which is fed by a developing roll 475b from a container 475a, in the same way as described above with respect to the first developing device 273 of the embodiment of FIGS. 10 and 11.

An image transfer device 477 is disposed below the magnetic drum 471 and the photosensitive paper 231 (as shown in FIG. 11), so that the paper 231 is fed between the transfer device 477 and the magnetic drum 471. The transfer device 477 is operated to magnetize the magnetic layer of the photosensitive paper 231, in order to magnetically attract the photomasking pattern 445 onto the magnetized magnetic layer of the paper 231. Thus, the photomasking pattern 445 is transferred to the photosensitive paper 231 as the light-shielding pattern 45. The drum 471 further rotated in the clockwise direction, a remnant of the toner 476 of the photomasking pattern 445 is removed by a cleaning blade 472a, and the removed toner 476 is stored in a casing 472b of the cleaning device 472. The photosensitive paper 231 is exposed by the exposing device 46, through the light-shielding pattern 45, and a latent image corresponding to the pattern 45 is optically formed. This optical latent image is developed into a visible image by the second developing device 48. The obtained visible image is sufficiently sharp owing to the light-shielding pattern 45 directly formed on the photosensitive paper 231.

While the present invention has been described in its presently preferred embodiments with a certain degree of particularity, it is to be understood that the invention is by no means confined to the precise details of the illustrated embodiments, but may be embodied with various changes, modifications and improvements, which may occur to those skilled in the art.

For example, it is possible to use a photosensitive recording medium wherein the chromogenic materials in the uncured microcapsules react with the developing material, when the optically exposed medium is developed under heat, rather than under pressure. Namely, the instant image recording apparatus may use a photosensitive medium of a heat-sensitive type, rather than a pressure-sensitive type.

Further, the photosensitive layer of a photosensitive recording medium may consist of microcapsules all of which contain the same chromogenic material for black, yellow, magenta, cyan or other desired color.

It is also possible to use a thermo-magnetic technique for forming a magnetic preliminary latent image which is developed into a light-shielding or photomasking pattern. More specifically, a pre-magnetized layer of a photosensitive recording medium is locally selectively demagnetized, or magnetically reversed, according to image information, by way of selectively heating the local portions of the pre-magnetized layer.

While the photosensitive paper 231 used in the embodiments of FIGS. 10 and 14 has the magnetic layer 232, it is possible to render the photosensitive paper 231 locally selectively magnetizable, without the exclusively provided magnetic layer 232. This can be achieved by the microcapsules 37 each of which contains a magnetic powder in addition to a chromogenic material and a radiation-curable resin.

Although the resin contained in each microcapsule 37 of the photosensitive papers used in the illustrated embodiments is cured upon exposure to a radiation, it is possible to use a resin which becomes brittle or softened upon exposure to a suitable radiation.

It will be obvious that other changes, modifications and improvements may be made in the present invention, without departing from the spirit and scope of the invention defined in the following claims.

What is claimed is:

1. An image recording apparatus, comprising:
   means for supporting a photosensitive recording medium, said photosensitive recording medium including a photosensitive layer sensitive to a radiation, a transparent electrically conductive layer formed on said photosensitive layer, and a transparent photoconductive layer formed on said transparent electrically conductive layer;
   means for discharging said transparent electrically conductive layer;
   a charger disposed opposite to said transparent photoconductive layer, for electrostatically charging an entire surface area of said photoconductive layer;
   first irradiating means for irradiating said transparent photoconductive layer with light according to image information, and thereby discharging through said electrically conductive layer and the grounding means an electrostatic charge from local portions of said entire surface area of said photoconductive layer, so as to form as a preliminary latent image an electrostatically discharged pattern on said photoconductive layer, said light being incapable of exposing said photosensitive layer to form an optical latent image thereon;
   means for applying a light-shielding material directly to the irradiated layer, so as to form as a light-shielding pattern a visible photomasking pattern corresponding to said preliminary latent image, said light-shielding material being capable of shielding a radiation;
   second irradiating means for irradiating the imagewise marked surface of said transparent photoconductive layer with said radiation, and thereby forming on said photosensitive layer an optical latent image corresponding to said photosensitive pattern;
   cleaning means for removing said photomasking pattern from the photosensitive recording medium after said optical latent image is formed; and
   developing means for developing said optical latent image into a visible image.

2. Apparatus as in claim 1 wherein the discharging means comprises means for grounding the transparent electrically conductive layer.

3. A photosensitive recording medium comprising a photosensitive layer sensitive to a first radiation, a translucent electrically conductive material formed on said photosensitive layer, and a translucent photoconductive layer formed on said translucent electrically conductive material, said photosensitive layer being normally dielectric and which is electrically conductive upon exposure thereof to a second radiation different from said first radiation, said translucent electrically conductive material including a portion thereof which contacts a discharging device of an image recording apparatus, said discharging device discharging through said electrically conductive material a portion of said translucent photoconductive layer, which portion is electrically conductive upon the exposure to said second radiation.

4. A photosensitive recording medium according to claim 3, wherein said photosensitive layer comprises a photosensitive and pressure-sensitive layer formed of microcapsules containing a chromogenic material.

5. A photosensitive recording medium according to claim 4, wherein said photosensitive layer comprises a developer layer formed of a developing material, said developing material reacting with said chromogenic material coming out of said microcapsules to produce a visible image.

* * * * *